United States Patent
Ighani et al.

(10) Patent No.: US 6,351,139 B1
(45) Date of Patent: Feb. 26, 2002

(54) CONFIGURATION BIT READ/WRITE DATA SHIFT REGISTER

(75) Inventors: Ramin Ighani, Santa Clara; Anup Nayak, Fremont, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/541,322

(22) Filed: Apr. 1, 2000

(51) Int. Cl.[7] .................................................. G06F 7/38
(52) U.S. Cl. ............................. 326/38; 326/40; 326/46
(58) Field of Search ............................. 326/38, 39, 40, 326/46

(56) References Cited

U.S. PATENT DOCUMENTS

| | | | | |
|---|---|---|---|---|
| 5,787,007 A | * | 7/1998 | Bauer ........................... | 364/489 |
| 5,844,422 A | * | 12/1998 | Trimberger et al. ........... | 326/38 |
| 5,941,974 A | * | 8/1999 | Babin ............................ | 710/130 |
| 6,055,594 A | * | 4/2000 | Lo et al. ....................... | 710/100 |

* cited by examiner

Primary Examiner—Michael Tokar
Assistant Examiner—Anh Q. Tran
(74) Attorney, Agent, or Firm—Christopher P. Maiorana, P.C.; Robert M. Miller

(57) ABSTRACT

An apparatus comprising a first circuit and a second circuit. The first circuit may be configured to (i) generate one or more first parallel data signals in response to a first serial data stream and a first control signal and (ii) generate a second serial data stream in response to one or more second parallel data signals and a second control signal. The second circuit may be configured to write the one or more first parallel data signals to and read the one or more second parallel data signals from an array of storage elements in response to one or more control signals.

20 Claims, 5 Drawing Sheets

CONFIGURATION BIT READ/WRITE DATA SHIFT REGISTER

FIELD OF THE INVENTION

The present invention relates to a method and/or architecture for reading and writing configuration bits for a programmable logic device generally and, more particularly, to a method and/or architecture for a configuration bit read/write data shift register.

BACKGROUND OF THE INVENTION

A programmable logic device (PLD) allows programmable logic to be implemented in an integrated circuit. Configuration bits are used to select the arrangement and operation of components within the PLD. In a static random access memory (SRAM) based PLD, the configuration bits are stored in a memory array.

The number of configuration bits can be very large. Programming the configuration bits in a parallel format would require a large number of pins that could be used for other purposes. A solution that would use a minimum number of pins to program configuration bits would be desirable.

In order to assure that a PLD is properly programmed, a solution that allows the configuration bits that are programmed into a programmable logic device to be verified would also be desirable.

SUMMARY OF THE INVENTION

The present invention concerns an apparatus comprising a first circuit and a second circuit. The first circuit may be configured to (i) generate one or more first parallel data signals in response to a first serial data stream and a first control signal and (ii) generate a second serial data stream in response to one or more second parallel data signals and a second control signal. The second circuit may be configured to write the one or more first parallel data signals to and read the one or more second parallel data signals from an array of storage elements in response to one or more control signals.

The objects, features and advantages of the present invention include providing a method and/or architecture for a configuration bit read/write data shift register that may (i) use the same line and/or node for writing and reading data to a memory array, (ii) save one or more lines per shift register on circuit layouts, (iii) receive configuration bits in a serial data stream, (iv) generate a serial stream of configuration bits, (v) allow verification of configuration bits and/or (vi) shift data for one column of memory while writing another column of memory.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
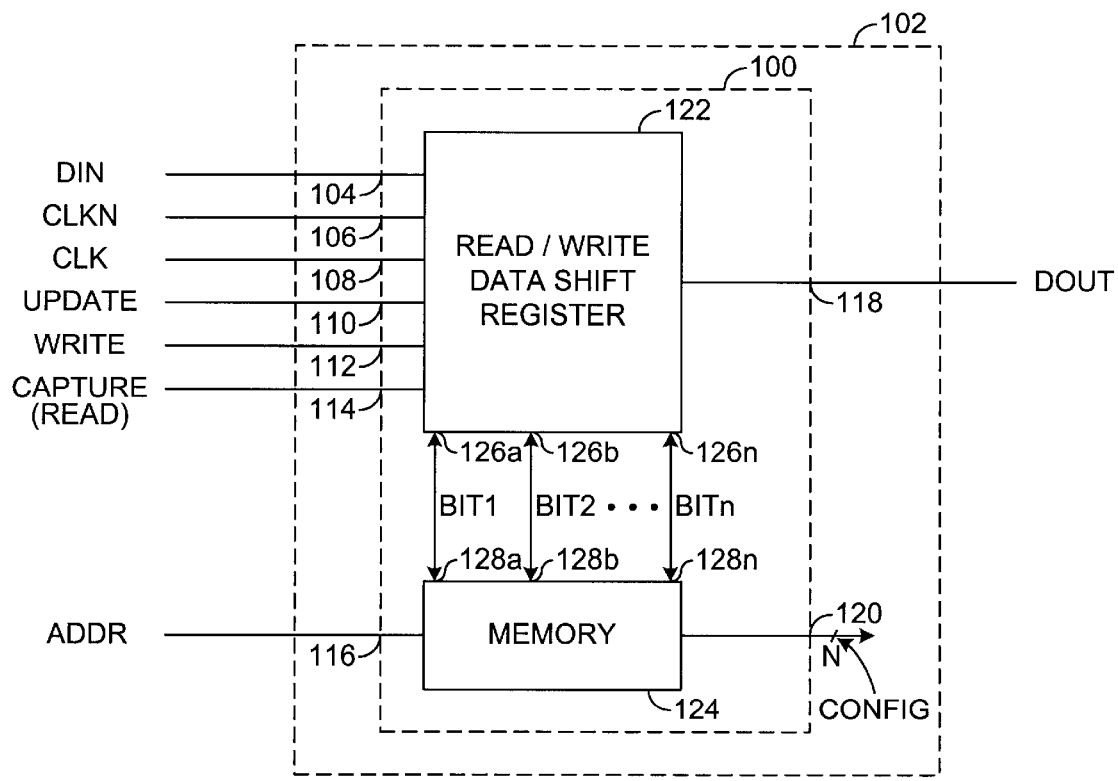
FIG. 1 is a block diagram of a preferred embodiment of the present invention.

Referring to FIG. 1, a block diagram of a circuit 100 is shown in accordance with a preferred embodiment of the present invention. The circuit 100 is shown implemented as a configuration bit memory circuit for a static random access memory (SRAM) based programmable logic device (PLD) 102. The circuit 100 may have an input 104 that may receive a signal (e.g., DIN), an input 106 that may receive a signal (e.g., CLKN), an input 108 that may receive a signal (e.g., CLK), an input 110 that may receive a signal (e.g., UPDATE), an input 112 that may receive a signal (e.g., WRITE), an input 114 that may receive a signal (e.g. CAPTURE), an input 116 that may receive a signal (e.g., ADDR), an output 118 that may present a signal (e.g., DOUT), and an output 120 that may present a signal (e.g., CONFIG).

The signals DIN and DOUT may be, in one example, serial data streams. The data bits of the signals DIN and DOUT may be configuration bits of the PLD 102. The signals CLKN and CLK may be internal or externally generated clock signals of the PLD 102. The signals UPDATE, WRITE, CAPTURE, and ADDR may be control signals. The circuit 100 may be configured to receive, store, and/or present the signal DIN and DOUT in response to one or more of the signals UPDATE, WRITE, CAPTURE, and ADDR. The signal CONFIG may be N-bits wide where N is an integer. The signal CONFIG may be used to control a configuration of logic elements and/or features of the PLD 102.

The circuit 100 may comprise a circuit 122 and a circuit 124. The circuit 122 may be implemented, in one example, as a read/write data shift register. The circuit 124 may be implemented, in one example as a memory circuit. The signals DIN, CLKN, CLK, UPDATE, WRITE, and CAPTURE may be presented to the circuit 122. The circuit 122 may have a number of input/outputs 126a–126n that may receive/present a number of signals (e.g., BIT1–BITn) from/to a number of input/outputs 128a–128n of the circuit 124. The circuit 122 may be configured to generate the signals BIT1–BITn and DOUT in response to one or more of the signals DIN, CLKN, CLK, UPDATE, WRITE, and CAPTURE. The signals BIT1–BITn may be, in one example bitline signals. The signals BIT1–BITn may comprise, in one example, a bitline signal (e.g., BLi) and a digital complement of the bitline signal (e.g., BLBi).

The signal ADDR may be presented to the circuit 124. The circuit 124 may be configured to read or write data to a number of storage elements in response to the signal ADDR. Data written may be presented by the circuit 122 as the signals BIT1–BITn. Data read may be presented by the circuit 124 as the signals BIT1–BITn.

Figure 2:
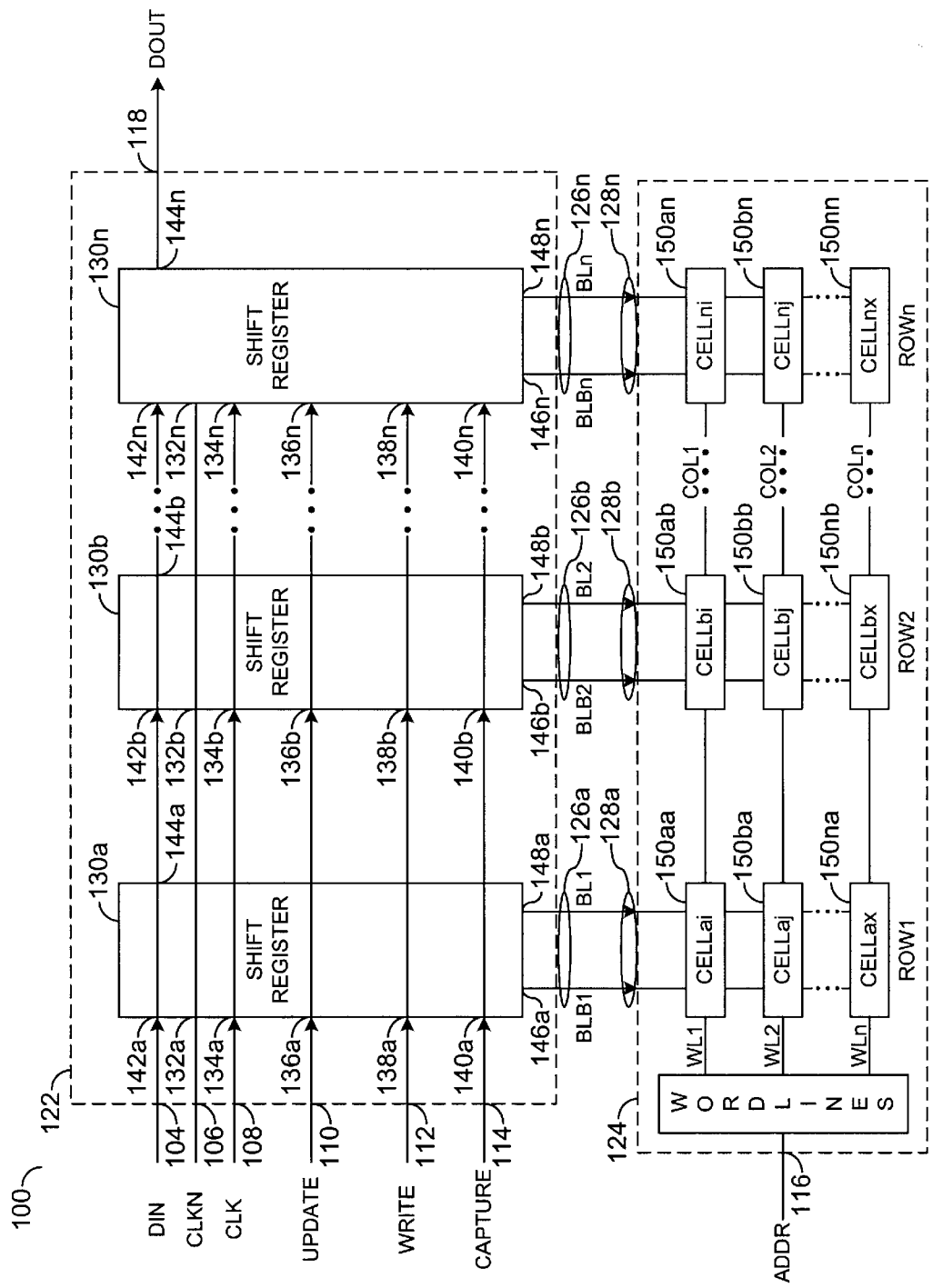
FIG. 2 is a detailed block diagram of the present invention.

Referring to FIG. 2, a detailed block diagram of the circuit 100 is shown. The circuit 122 may comprise a number of circuits 130a–130n. The circuits 130a–130n may be implemented, in one example, as one-bit wide shift registers. The circuit 130a–130n may have an input 132a–132n that may receive the signal CLKN, an input 134a–134n that may receive the signal CLK, an input 136a–136n that may receive the signal UPDATE, an input 138a–138n that may receive the signal WRITE, and an input 140a–140n that may receive the signal CAPTURE.

The circuits 130a–130n may have an input 142a–142n and an output 144a–144n. In one example, the signal DIN may be presented to the input 142a. The circuits 130a–130n may be connected serially. The output 144a may be connected to the input 142b, the output 144b may be connected to the input 142c, etc. The output 144n may present the signal DOUT. Each of the circuits 130a–130n may be configured to present and receive (i) one of the signals BL1–BLn at an output 146a–146n and (ii) one of the signals BLB1–BLBn at an output 148a–148n. Data bits contained in the signal DIN may be shifted through the circuits 130a–130n until each of the circuits 130a–130n is holding a bit. When each of the circuits 130a–130n contains a data bit, the circuits 130a–130n may be configured to present the signals BL1–BLn and BLB1–BLBn to the circuit 124 in response to one or more of the signals CLKN, CLK, UPDATE, WRITE, and CAPTURE. The process described above may be repeated a number of times until the data contained in the signal DIN has been transferred to the circuit 124.

The circuit 124 may present a number of data bits to the circuits 130a–130n as the signals BL1–BLn and BLB1–BLBn. The circuits 130a–130n may be configured to shift the data bits through the circuits 130a–130n and present each data bit in series as the signal DOUT. The process may be repeated until the data contained in the circuit 124 has been transferred to the signal DOUT.

The circuit 124 may comprise an array of storage elements 150aa–150nn arranged, in one example, in rows and columns. The number of rows and columns may be similar or different and varied to meet the design criteria of a particular application. In one example, the storage elements may be implemented as static random access memory cells (SRAM). Each of the signals BL1–B1n and BLB1–BLBn may be present to a row of storage elements (e.g., the signals BL1 and BLB1 may be presented to the storage elements 150aa–150na). Each column of storage elements (e.g., 150aa–150an) may receive a control signal (e.g., WL1–WLn). The control signals WL1–WLn may be generated in response to the signal ADDR. The signals WL1–WLn may be used to determine the particular column of storage elements (e.g., Col.1, Col. 2, etc.) that may receive or generate the signals BL1–BLn and BLB1–BLBn.

Figure 3:
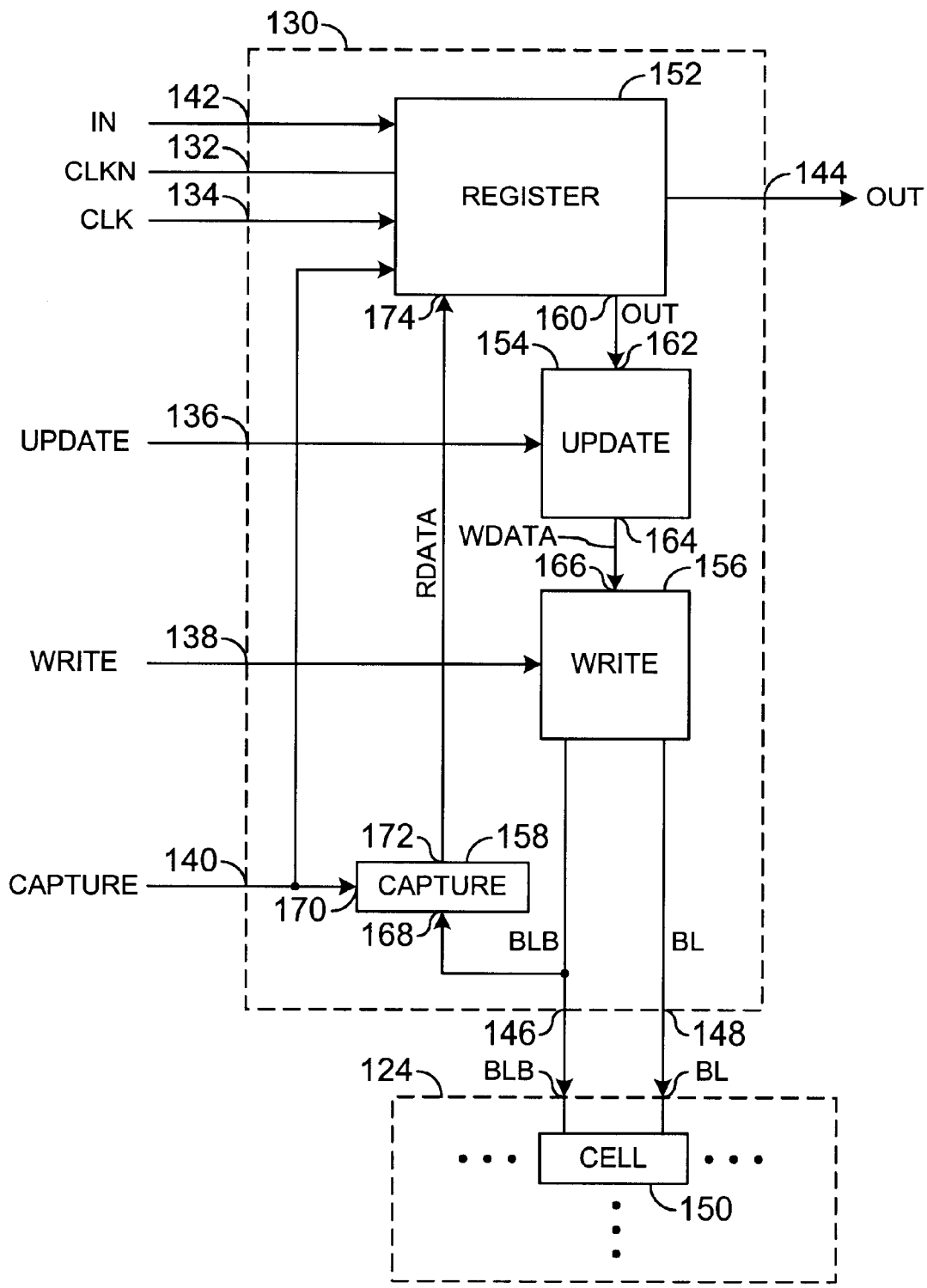
FIG. 3 is a detailed block diagram of a shift register circuit of FIG. 2.

Referring to FIG. 3, a detailed block diagram of an exemplary shift register circuit 130 is shown. The circuit 130 may comprise a register circuit 152, an update circuit 154, a write latch 156, and a capture circuit 158. The signals CLKN, CLK, CAPTURE, and a data signal (e.g., IN) may be presented to the register 152. The register circuit 152 may be configured to latch the data signal IN in response to one or more of the signals CLKN, CLK, and CAPTURE. The circuit 152 may be configured to present the latched data as a signal OUT at the output 144. The circuit 152 may have an output 160 that may present the signal OUT to an input 162 of the circuit 154.

The signal UPDATE may be presented to the circuit 154. The circuit 154 may be configured to latch the signal OUT in response to the signal UPDATE. The circuit 154 may have an output 164 that may present a signal (e.g., WDATA) to an input 166 of the circuit 156. Once the signal OUT has been latched by the circuit 154, new data may be shifted into the circuit 152.

The circuit 156 may be configured to generate, in one example, the signals BL and BLB in response to the signal WDATA and the signal WRITE. When the signals BL and BLB are generated in response to the signal WRITE, the data in the signal WDATA is generally written into a storage element 150 of the circuit 124. The particular storage element 150 may be selected in response to the signal ADDR.

The signal WRITE may be in an inactive state when data is not being written to the circuit 124. When the signal WRITE is in the inactive state, the signals BL and BLB may reflect data in a storage element 150. The signal BLB may be presented to an input 168 of the circuit 158. The circuit 158 may be implemented, in one example, as a sense amplifier. The circuit 158 may have an input 170 that may receive the signal CAPTURE and an output that may present a signal (e.g., RDATA) to an input 174 of the circuit 152. The circuit 152 may be configured to latch the signal RDATA in response to one or more of the signals CLKN, CLK, and CAPTURE. Once the signal RDATA has been latched in the circuit 152, the data contained in the signal RDATA may be shifted to a next circuit 130 as the signal OUT in response to one or more of the signals CLKN and CLK.

Figure 4:
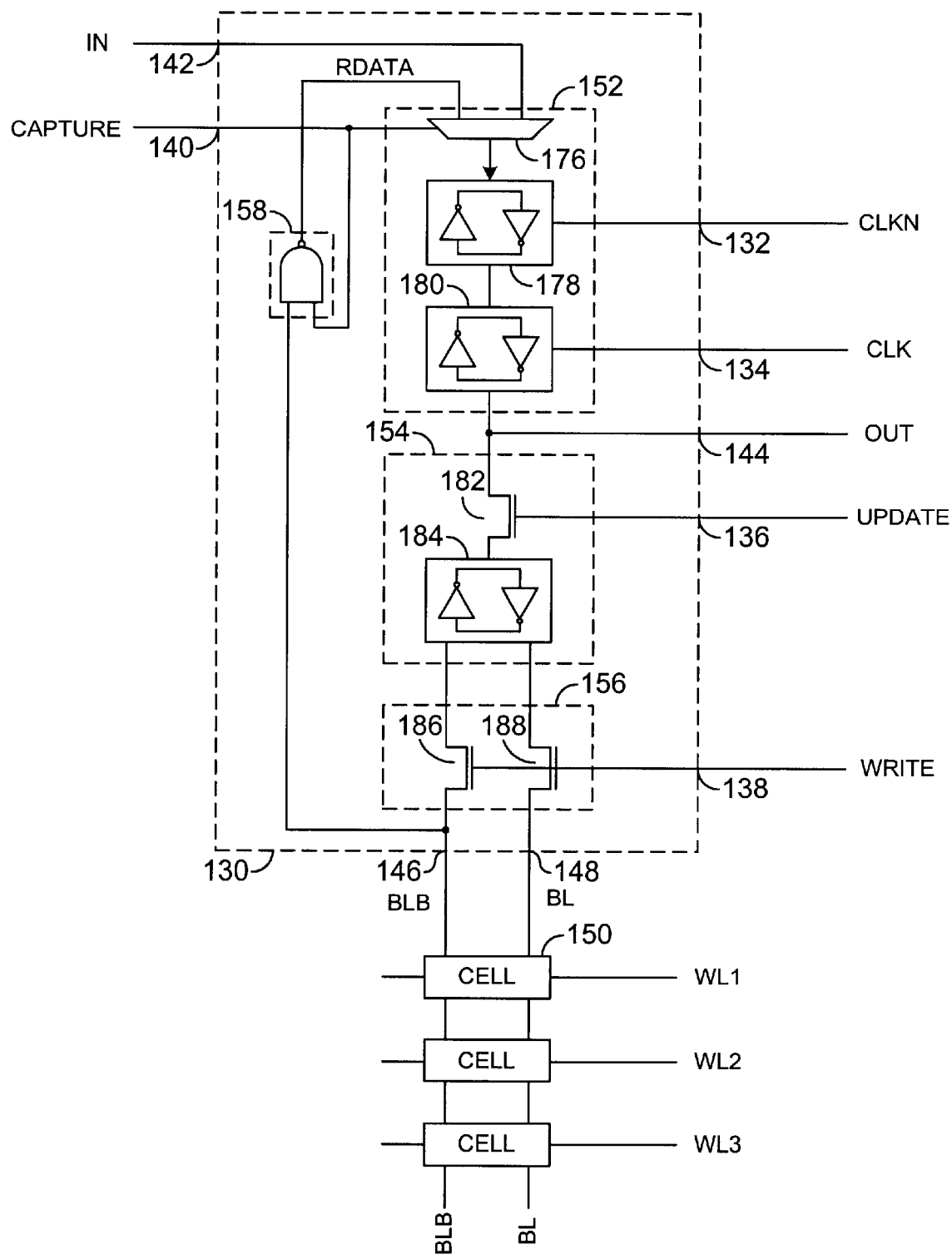
FIG. 4 is a more detailed block diagram of a shift register circuit of FIG. 3.

Referring to FIG. 4, a more detailed block diagram of the circuit 130 is shown. In one example, the circuit 152 may comprise a multiplexer 176, a latch 178, and a latch 180. The circuit 154 may comprise a transistor 182 and a latch 184. The circuit 156 may comprise a transistor 186 and a transistor 188. The circuit 158 may be implemented as an NAND gate. The multiplexer 176 may have a first input that may receive the signal IN, a second input that may receive the signal RDATA, a control input that may receive the signal CAPTURE, and an output that may present a signal to an input of the latch 178. The multiplexer 176 generally selects the signal IN or the signal RDATA as the signal presented to the latch 178 in response to the signal CAPTURE.

The latch 178 may be configured to latch the signal received from the multiplexer 176 in response to the signal CLKN. The latch 178 may have an output that may present a signal to an input of the latch 180. The latch 180 may be configured to latch the signal received from the latch 178 in response to the signal CLK. The latch 180 may have an output that may present the signal OUT.

The signal OUT may be presented to a first source/drain of the transistor 182. The signal UPDATE may be presented to a gate of the transistor 182. A second source/drain of the transistor 182 may be connected to an input of the latch 184. The latch 184 may have, in one example, a first output that may present a first signal to a first source/drain of the transistor 186 and a second output that may present a second signal to a first source/drain of the transistor 188. The signal WRITE may be presented to a gate of the transistors 186 and 188. A second source/drain of the transistor 186 may present the signal BLB. A second source/drain of the transistor 188 may present the signal BL.

The signal BLB may be presented to a first input of the NAND gate 158. The signal CAPTURE may be presented to a second input of the NAND gate 158. The signal RDATA may be present at an output of the NAND gate 158 in response to the signals BLB and CAPTURE.

Figure 5:
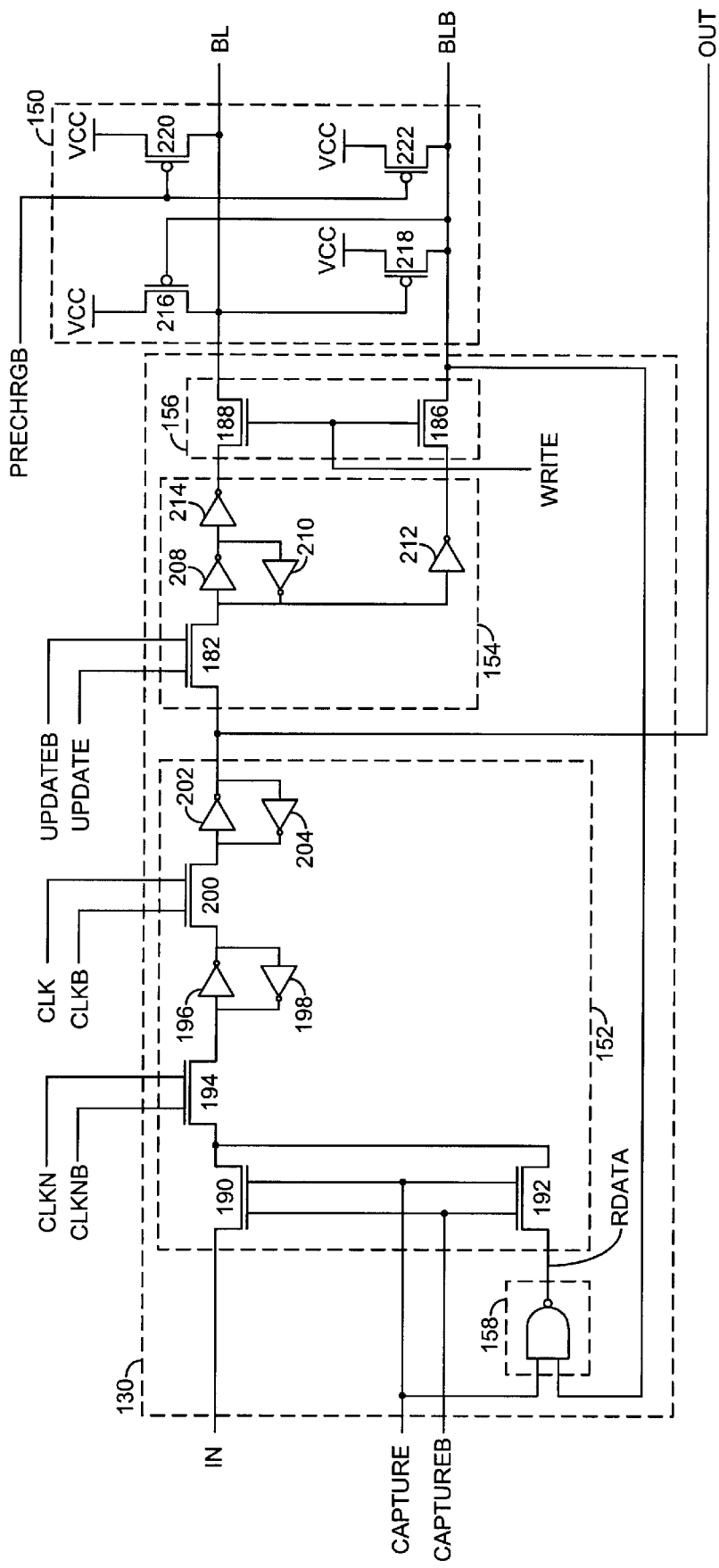
FIG. 5 is a schematic diagram of a circuit 130 of FIG. 3 illustrating a preferred embodiment of the present invention.

Referring to FIG. 5, a schematic diagram of the circuit 130 illustrating a preferred embodiment of the present invention is shown. The signals CLKN, CLK, UPDATE, and CAPTURE may be presented, in one example, as complementary pairs of signals (e.g., CLKN and CLKNB, CLK and CLKB, UPDATE and UPDATEB, and CAPTURE and CAPTUREB). A signal (e.g., PRECHRGB) may be used to precharge the bitlines BL and BLB before accessing a memory cell.

The circuit 152 may comprise a CMOS switch 190, a CMOS switch 192, a CMOS switch 194, a gate 196, a gate 198, a CMOS switch 200, a gate 202, and a gate 204. The CMOS switches 190, 192, 194, and 200 may be implemented, in one example, as a NMOS and a PMOS transistor pair. However, other types and polarities of transistors may be implemented accordingly to meet the design criteria of a particular application. The gates 196, 198, 202, and 204 may be implemented, in one example, as inverters. However, other types of gates may be implemented to meet the design criteria of a particular application. The signal IN may be presented to a first source/drain of the CMOS switch 190. The signal CAPTURE may be presented to a first gate of the CMOS switches 190 and 192. The signal CAPTUREB may be presented to a second gate of the CMOS switches 190 and 192. The signal RDATA may be presented to a first source/drain of the CMOS switch 192. A second source/drain of the CMOS switch 190 may be connected to a second source/drain of the CMOS switch 192 and a first source/drain of the CMOS switch 194. The signals CLKN and CLKNB may be presented to a first and a second gate of the CMOS switch 194, respectively. A second source/drain of the CMOS switch 194 may be connected to an input of the inverter 196 and an output of the inverter 198. An output of the inverter 196 may be connected to an input of the inverter 198 and a first source/drain of the CMOS switch 200. The signals CLK and CLKB may be presented to a first and a second gate of the CMOS switch 200, respectively. A second source/drain of the CMOS switch 200 may be connected to an input of the inverter 202 and an output of the inverter 204. An output of the inverter 202 may be connected to an input of the inverter 204. The signal OUT may be presented at the output of the inverter 202.

The circuit 154 may comprise the transistor 182, a gate 208, a gate 210, a gate 212, and a gate 214. The transistor 182 may be implemented, in one example, as one or more NMOS transistors or a CMOS switch. However, other types and polarities of transistors may be implemented accordingly to meet the design criteria of a particular application. The gates 208, 210, 212, and 214 may be implemented, in one example, as inverters. However, other types of gates may be implemented to meet the design criteria of a particular application.

The signal OUT may be presented to a first source/drain of the transistor 182. The signals UPDATE and UPDATEB may be presented to a first and second gate of the transistor 182, respectively. A second source/drain of the transistor 182 may be connected to an input of the inverter 208, an output of the invert 210, and an input of the inverter 212. An output of the inverter 208 may be connected to an input of the inverter 210 and the inverter 214. An output of the inverter 212 may be connected to the first source/drain of the transistor 186. An output of the inverter 214 may be connected to the first source/drain of the transistor 188.

The circuit 150 may comprise a transistor 216, a transistor 218, a transistor 220, and a transistor 222. The transistors 216, 218, 220, and 222 may be implemented, in one example, as one or more PMOS transistors. However, other types and polarities of transistors may be implemented accordingly to meet the design criteria of a particular application. The signal BL may be presented to (i) a drain of the transistor 216, (ii) a gate of the transistor 218, and (iii) a drain of the transistor 220. The signal BLB may be presented to (i) a drain of the transistor 218, (ii) a gate of the transistor 216, and (iii) a drain of the transistor 222. A source of the transistors 216, 218, 220, and 222 may be connected to a supply voltage (e.g., VCC). A gate of the transistors 220 and 222 may receive a control signal (e.g., PRECHRGB). The signal PRECHRGB may be used to control a pre-charge operation of the bitlines carrying the signals BL and BLB.

During read and write operations, the signal BL may be, in one example, in a first logic state (e.g., a logic LOW, or 0) while the signal BLB, in one example, may be in a second logic state (e.g., a logic HIGH, or 1). The transistors 216 and 218 may operate, in one example, to maintain the respective logic states. When the signal BL is LOW, the gate of the transistor 218 is generally LOW. When the gate of the transistor 218 is LOW, the signal BLB is generally pulled HIGH and the transistor 216 is generally turned off. When the signal BLB is LOW, the gate of the transistor 216 is generally LOW. When the gate of the transistor 216 is LOW, the signal BL is generally pulled HIGH and the transistor 218 is generally turned off.

During a read operation, a storage cell (described in connection with FIG. 6 below) may be configured to pull the signal BL or the signal BLB LOW. Before a read operation is performed, the signal PRECHRGB may be presented to a gate of the transistors 220 and 222. The transistors 220 and 222 may pull the signals BL and BLB HIGH in response to the signal PRECHRGB. When the storage cell is read, the storage cell generally pulls the signal BL or the signal BLB LOW. The transistors 216 and 218 will generally assist the storage cell by pulling the opposite signal BLB or BL HIGH as described above. During a read operation, the signal WRITE is generally LOW. The logic state of the signal BLB may be presented to the circuit 152 by the sense amplifier 156 in response to the signal CAPTURE.

Figure 6:
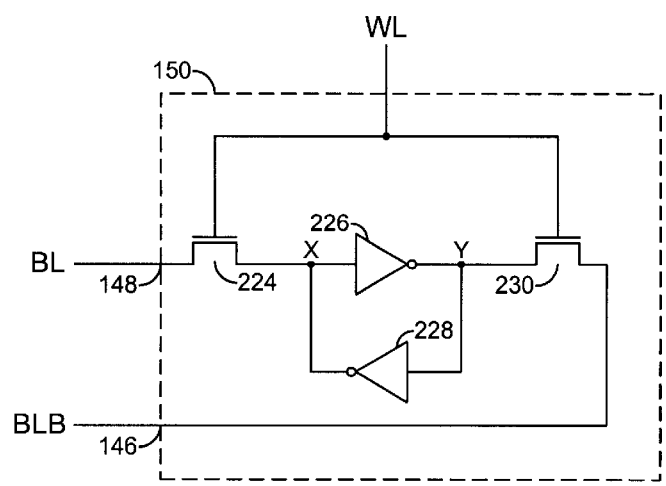
FIG. 6 is a schematic diagram illustrating a circuit 150 of FIG. 3.

Referring to FIG. 6, a schematic diagram illustrating a storage cell of the circuit 150 in accordance with the present invention is shown. The circuit 150 may further comprise a transistor 224, a gate 226, a gate 228, and a transistor 230. The transistors 224 and 230 may be implemented, in one example, as one or more NMOS transistors. However, other types and polarities of transistors may be implemented accordingly to meet the design criteria of a particular application. The gates 226 and 228 may be implemented, in one example, as inverters. However, other types of gates may be implemented accordingly to meet the design criteria of a particular application.

The signal BL may be presented to or received from a first source/drain of the transistor 224. A second source/drain of the transistor 224 may be connected to an input of the gate 226 and an output of the gate 228. An output of the gate 226 may be connected to an input of the gate 228 and a first source/drain of the transistor 230. A second source/drain of the transistor 230 may present or receive the signal BLB. A signal (e.g., WL) may be presented to a gate of the transistor 224 and 230. The signal WL may be a wordline signal. The circuit 150 may store a logic "0" as, in one example, a first logic level (e.g., LOW) at a node (e.g., X) and a second logic level (e.g., HIGH) at a second node (e.g., Y) in response to the signals BL, BLB, and WL. The circuit 150 may store a logic "1", in one example, by setting the nodes X and Y to the second logic state and first logic state, respectively. However, other logic states may be set to meet the design criteria of a particular application. The circuit 150 will generally read or write data to the storage cell in response to the signal WL. The same lines (e.g., BL and BLB) may be used to read data from or write data to the storage cell.

The present invention may provide a method and/or architecture that may (i) use the same line and/or node for writing and reading, (ii) save one or more lines per shift register on circuit layouts, and/or (iii) shift data in for a next column of memory while a current column is being written.

The circuit 100 may provide for loading the configuration bits of a SRAM based PLD using a serial bit stream presented to a single pin. The circuit 100 may also provide for verifying the configuration bits of a SRAM based PLD. During a programming operation, serial data may be shifted into a number of registers 152a–152n. When the registers 152a–152n are loaded, the signal UPDATE may be asserted (e.g., HIGH, or a digital '1') to latch the data into a number of circuits 154a–154n. When the data has been latched into the circuits 154a–154n, a new column of data may be shifted into the registers 152a–152n. While new data is being shifted into the registers 152a–152n, the signal WRITE may be asserted. When the signal WRITE is asserted, the data contained in the circuits 154a–154n is generally written into storage elements in the circuit 124. The data may be written by asserting and deasserting the signals BL1–B1n and BLB1–BLBn. The storage elements to which data is written may be determined in response to the signal ADDR.

The circuits 154a–154n may allow a next column of data to be shifted into the registers 152a–152n while the current column of data is written into storage elements of the circuit 124. By loading the next column while the current column is written to memory, the circuit 100 may save one cycle during each "write" operation. However, the circuits 154a–154n may be eliminated in applications where data need not be loaded simultaneously with writing data.

During an example verification operation, the storage elements 150aa–150nn of the circuit 124 may generate the signals BL1–BLn and BLB1–BLBn in response to the signal ADDR. The signal CAPTURE is generally asserted allowing the data stored in the selected storage elements to be latched into the registers 152a–152n. When the data from the storage elements has been latched into the registers 152a–152n, the circuit 100 may generate a serial data stream by serially shifting the data in the registers 152a–152n. The serial data stream may be presented at an output pin of a PLD.

The various signals described above are generally "on" (e.g., a digital HIGH, or 1) or "off" (e.g., a digital LOW or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to (i) generate one or more first parallel data signals in response to a first serial data stream and a first control signal and (ii) generate a second serial data stream in response to one or more second parallel data signals and a second control signal; and
    a second circuit configured to write said one or more first parallel data signals to and read said one or more second parallel data signals from an array of storage elements in response to one or more control signals.

2. The apparatus according to claim 1, wherein said serial data stream comprises configuration bits of a programmable logic device.

3. The apparatus according to claim 1, wherein said first circuit comprises a plurality of shift registers.

4. The apparatus according to claim 3, wherein each of said plurality of shift registers comprises a sense amplifier.

5. The apparatus according to claim 4, wherein said sense amplifier comprises a NAND gate, wherein said NAND gate responds to said second control signal.

6. The apparatus according to claim 3, wherein said shift registers comprise one or more latches.

7. The apparatus according to claim 1, wherein said apparatus comprises a configuration bit memory circuit of a programmable logic device.

8. The apparatus according to claim 7, wherein said programmable logic device is static random access memory based.

9. The apparatus according to claim 1, wherein said first control signal comprises a write signal.

10. The apparatus according to claim 1, wherein said second control signal comprises a capture signal.

11. The apparatus according to claim 3, wherein a said first and second serial data streams are shifted in response to one or more clock signals.

12. The apparatus according to claim 1, wherein said second serial data stream is configured to verify a configuration of a programmable logic device.

13. The apparatus according to claim 1, wherein said first and second parallel data signals are presented on the same lines.

14. The apparatus according to claim 1, wherein one of said one or more first parallel data signals is generated concurrently with another of said one or more first parallel data signals being written to said array of storage elements.

15. The apparatus according to claim 1, wherein said storage elements comprise a latch configured to receive and present data using the same bitlines.

16. The apparatus according to claim 15, wherein a logic state of said bitlines is maintained by a pair of transistors.

17. The apparatus according to claim 15, wherein said bitlines are precharged before a read operation.

18. An apparatus comprising:
    means for (i) generating one or more first parallel data signals in response to a first serial data stream and a first control signal and (ii) generating a second serial data stream in response to one or more second parallel data signals and a second control signal; and
    means for writing said one or more first parallel data signals to and reading said one or more second parallel data signals from an array of storage elements in response to one or more control signals.

19. A method for programming and verifying configuration bits comprising the steps of:
    (A) generating a first parallel data signal in response to a first serial data stream and a first control signal;
    (B) writing said first parallel data signal to an array of storage elements in response to one or more control signals;
    (C) reading a second parallel data signal from said array of storage elements in response to said one or more control signals; and
    (D) generating a second serial data stream in response to said second parallel data signal and a second control signal.

20. The method according to claim 17, wherein step (B) comprises the sub-step of:
    (B-1) generating one of said one or more first parallel data signals concurrently with writing another of said one or more first parallel data signals to said array of storage elements.

* * * * *